United States Patent
Wang et al.

(10) Patent No.: US 10,483,407 B2
(45) Date of Patent: Nov. 19, 2019

(54) METHODS OF FORMING SI$_3$N$_x$, METHODS OF FORMING INSULATOR MATERIAL BETWEEN A CONTROL GATE AND CHARGE-STORAGE MATERIAL OF A PROGRAMMABLE CHARGE-STORAGE TRANSISTOR, AND METHODS OF FORMING AN ARRAY OF ELEVATIONALLY-EXTENDING STRINGS OF MEMORY CELLS AND A PROGRAMMABLE CHARGE-STORAGE TRANSISTOR MANUFACTURED IN ACCORDANCE WITH METHODS

(71) Applicant: Micron Technology, Inc., Boise, ID (US)

(72) Inventors: Fei Wang, Boise, ID (US); Kunal Shrotri, Boise, ID (US); Jeffery B. Hull, Boise, ID (US); Anish A. Khandekar, Boise, ID (US); Duo Mao, Boise, ID (US); Zhixin Xu, Singapore (SG); Ee Ee Eng, Boise, ID (US); Jie Li, Boise, ID (US); Dong Liang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/957,594

(22) Filed: Apr. 19, 2018

(65) Prior Publication Data

US 2019/0326445 A1    Oct. 24, 2019

(51) Int. Cl.
*H01L 21/28*    (2006.01)
*H01L 27/1157*    (2017.01)
(Continued)

(52) U.S. Cl.
CPC ...... *H01L 29/7923* (2013.01); *G11C 16/0466* (2013.01); *G11C 16/0483* (2013.01);
(Continued)

(58) Field of Classification Search
CPC .......... H01L 29/7923; H01L 29/66833; H01L 21/28282; H01L 27/1157; G11C 16/0466; G11C 16/0483; G11C 16/08
(Continued)

(56) References Cited

U.S. PATENT DOCUMENTS 6,375,756 B1 * 4/2002 Ishibashi ............. C23C 16/4405
134/1.3
2010/0034023 A1 * 2/2010 Shingu .............. H01L 21/28282
365/185.18
(Continued)

*Primary Examiner* — Tong-Ho Kim
(74) *Attorney, Agent, or Firm* — Wells St. John P.S.

(57) ABSTRACT

A method of forming Si$_3$N$_x$, where "x" is less than 4 and at least 3, comprises decomposing a Si-comprising precursor molecule into at least two decomposition species that are different from one another, at least one of the at least two different decomposition species comprising Si. An outer substrate surface is contacted with the at least two decomposition species. At least one of the decomposition species that comprises Si attaches to the outer substrate surface to comprise an attached species. The attached species is contacted with a N-comprising precursor that reacts with the attached species to form a reaction product comprising Si$_3$N$_x$, where "x" is less than 4 and at least 3. Other embodiments are disclosed, including constructions made in accordance with method embodiments of the invention and constructions independent of method of manufacture.

28 Claims, 14 Drawing Sheets

(51) Int. Cl.
*H01L 29/66* (2006.01)
*G11C 16/04* (2006.01)
*G11C 16/08* (2006.01)
*H01L 29/792* (2006.01)

(52) U.S. Cl.
CPC ........ *G11C 16/08* (2013.01); *H01L 21/28282* (2013.01); *H01L 27/1157* (2013.01); *H01L 29/66833* (2013.01)

(58) Field of Classification Search
USPC .......................................................... 257/324
See application file for complete search history.

(56) References Cited

U.S. PATENT DOCUMENTS

| 2010/0055927 | A1* | 3/2010 | Hirose | C23C 16/345 |
| | | | | 438/791 |
| 2011/0076857 | A1* | 3/2011 | Akae | C23C 16/32 |
| | | | | 438/769 |
| 2014/0191306 | A1* | 7/2014 | Hopkins | H01L 29/7889 |
| | | | | 257/315 |
| 2017/0352677 | A1* | 12/2017 | Zhu | H01L 27/11521 |

* cited by examiner

US 10,483,407 B2

METHODS OF FORMING SI₃N_X, METHODS OF FORMING INSULATOR MATERIAL BETWEEN A CONTROL GATE AND CHARGE-STORAGE MATERIAL OF A PROGRAMMABLE CHARGE-STORAGE TRANSISTOR, AND METHODS OF FORMING AN ARRAY OF ELEVATIONALLY-EXTENDING STRINGS OF MEMORY CELLS AND A PROGRAMMABLE CHARGE-STORAGE TRANSISTOR MANUFACTURED IN ACCORDANCE WITH METHODS

TECHNICAL FIELD

Embodiments disclosed herein pertain to materials containing both silicon and nitrogen, to programmable charge-storage transistors, to arrays of elevationally-extending strings of memory cells, and to methods of fabricating such materials and structures.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor.

Charge-storage regions of programmable field effect transistors are programmed (written to by storing charge therein) and erased (removing the stored charge) by applying suitable respective program and erase voltages at least to the conductive gate. Higher programming and erase voltages are desired as such may provide more assurance that the desired effect (i.e., program or erase) is achieved as compared to lower voltages.

DETAILED DESCRIPTION OF EXAMPLE EMBODIMENTS

Embodiments of the invention encompass methods of forming $Si_3N_x$, where "x" is less than 4 and at least 3.

Embodiments of the invention also encompass methods of forming insulator material comprising $Si_3N_x$ that is ultimately between a control gate and charge-storage material of a programmable charge-storage transistor. Embodiments of the invention also encompass methods of forming an array of elevationally-extending strings of memory cells, for example an array of NAND memory cells. Embodiments of the invention also encompass constructions produced in accordance with a method of the invention, and constructions independent of method of manufacture.

Method embodiments have at least three steps that are acted upon a substrate, namely, and in the following temporal sequence and order: [a] a decomposing step, [b] a contacting step, and [c] another contacting step, for example as described below. The substrate acted upon may be subjected to processing before and/or after the above sequence. Regardless, processing of the substrate (e.g., relative to a processing chamber within which the substrate is received) may occur between any two of [a], [b], and [c] in such sequence. Regardless, the [a], [b], and [c] sequence may be repeated, and individual components within such sequence need not be the same as a previous sequence and/or sequences. Accordingly, "repeated" and "repeating" herein with respect to a minimum three-step sequence do not require individual of the steps to be identical with one or more steps in an earlier minimum three-step sequence. Example embodiments of a method comprising a sequence in accordance with the invention are initially described with reference to FIGS. 1-6.

Figure 1:
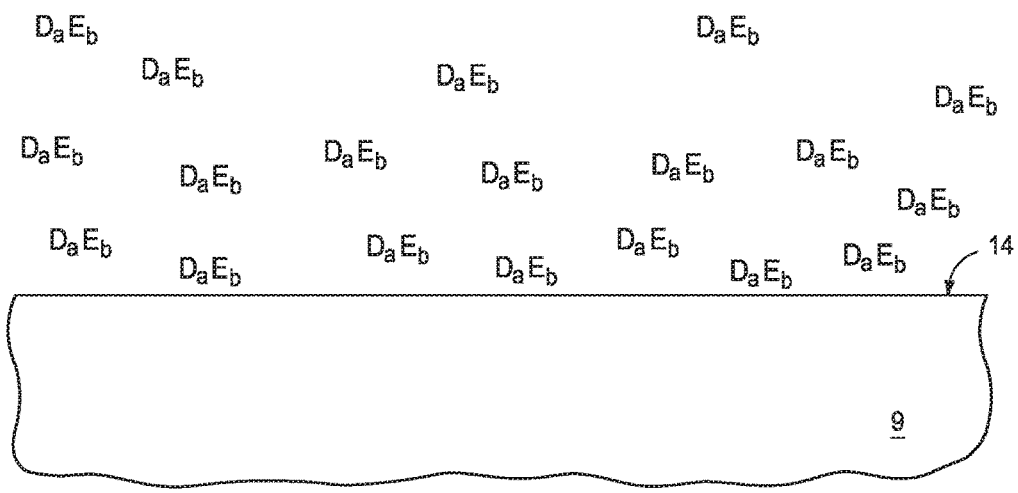
FIG. 1 is a diagrammatic cross-sectional view of a portion of a substrate in process in accordance with an embodiment of the invention.

Referring to FIG. 1, a substrate or substrate fragment 9 in process comprises an outer substrate surface 14. Substrate 9 may comprise a semiconductor substrate. In this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 9 would, by way of example, be part of a larger substrate, for example a semiconductor wafer which would be positioned within any suitable existing or yet-to-be-developed processing chamber within which one or more substrates being processed can be received and exposed to processing substances.

A Si-comprising precursor molecule is decomposed into at least two decomposition species that are different from one another, with at least one of such at least two different decomposition species comprising silicon (in elemental-form and/or in a moiety). Ideally, the decomposing comprises thermal decomposition (e.g., in the absence of plasma whether remotely generated and/or generated in a chamber in which a substrate being processed is received) of the Si-comprising precursor molecule and at a temperature of at least 500° C. However, in one embodiment, plasma may be used. In one embodiment, the decomposing consists essentially of thermal decomposition. Regardless, in one embodiment and ideally, such decomposing occurs directly above outer substrate surface 14. For illustration purposes, FIG. 1 shows an example Si-comprising precursor molecule as being $D_aE_b$ that is within a chamber, for example, within which substrate 9 is received. Si-comprising precursor molecules $D_aE_b$ are shown as being directly above outer substrate surface 14. "D" and "B" may individually comprise one or more elements and/or moieties with at least one of "D" and "E" comprising silicon and with "D" and "E" being different from one another. "a" and "b" would each be greater than zero, indicate atomic quantity, and may be the same or different relative one another. In one embodiment, the Si-comprising precursor molecule comprises silane, and in one such embodiment comprises a chlorosilane. Examples include hexachlorodisilane (e.g., "D" being $SiCl_2$, "E" being $SiCl_4$, and "a" and "b" each being 1), dichlorosilane (e.g., "D" being $SiCl_2$, "B" being H, "a" being 1, and "b" being 2), and trichlorosilane (e.g., "D" being $SiCl_3$ and/or $SiCl_2$, "E" being H and/or HCl, and "a" and "b" each being 1). In one embodiment, the Si-comprising precursor molecule comprises silicon tetrachloride (e.g., "D" being SiCl, $SiCl_2$, and/or $SiCl_3$; "E" being Cl and/or $Cl_2$; and "a" and "b" each being 1). FIG. 1 shows Si-comprising precursor molecules $D_aE_b$ directly above outer substrate surface 14 prior to any decomposition thereof. Regardless, by way of example, Si-comprising precursor molecule $D_aE_b$ may be electrically neutral, an ion, a radical, etc. and ideally is at least primarily in a gaseous state.

Figure 2:
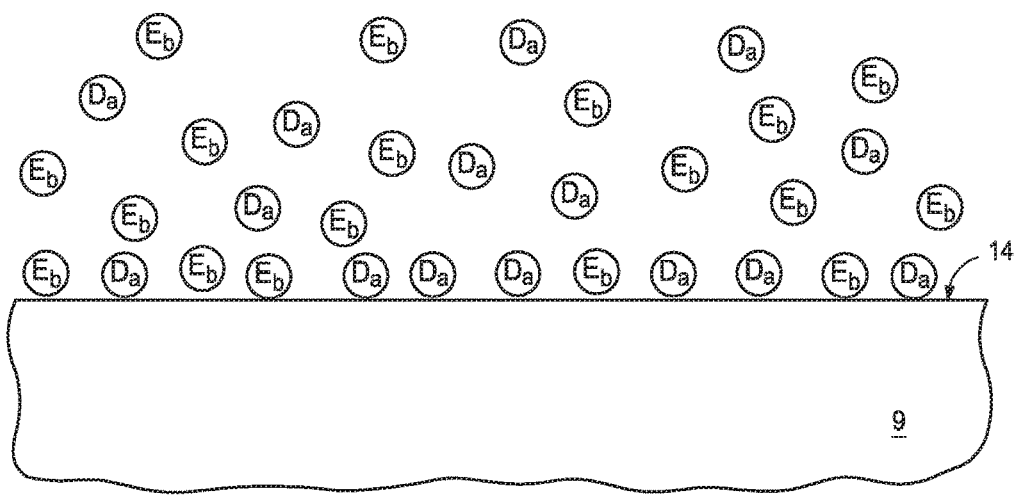
FIG. 2 is a view of the FIG. 1 substrate at a processing step subsequent to that shown by FIG. 1.

FIG. 2 shows individual Si-comprising precursor molecules $D_aE_b$ (not shown) as having been decomposed into two decomposition species $D_a$ and $E_b$ that are different (i.e., compositionally) from one another, and with at least one of those species $D_a$ and $E_b$ comprising Si. In one embodiment, each of two different composition species comprises Si and in another embodiment only one of all of the decomposition species comprises Si. Regardless, outer substrate surface 14 is contacted with the at least two decomposition species. At least one of the decomposition species that comprises Si (e.g., which may be only one of the decomposition species) attaches to outer substrate surface 14 (e.g., by any one or more of chemisorption, physisorption, adsorption, and absorption) to comprise an attached species.

Figure 3:
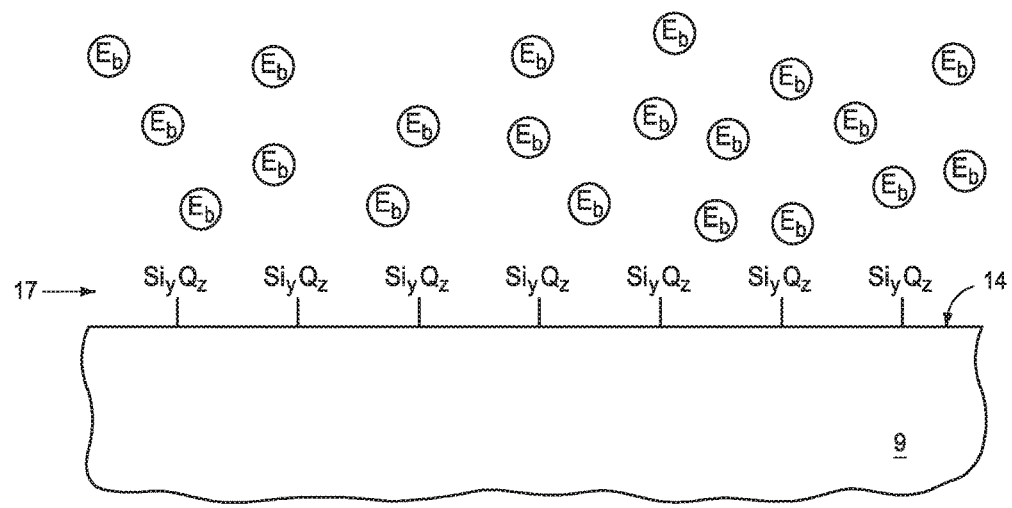
FIG. 3 is a view of the FIG. 2 substrate at a processing step subsequent to that shown by FIG. 2.

For example, FIG. 3 diagrammatically shows an embodiment wherein decomposition species $D_a$ (not shown) is or comprises $Si_yQ_z$ (each of "y" and "z" being greater than 0) that has attached to outer substrate surface 14 to thereby comprise an attached species $Si_yQ_z$ (e.g., $SiCl_2$ where $D_aE_b$ is $Si_2Cl_6$, with $D_a$ being $SiCl_2$ and $E_b$ being $SiCl_4$). Decomposition species $E_b$, regardless of whether comprising silicon, is shown as not having attached to outer substrate surface 14 although decomposition species $E_b$ has contacted outer substrate surface 14. In one embodiment, the decomposing and the contacting of outer substrate surface 14 with the at least two decomposition species occur in the same deposition chamber at the same temperature and pressure conditions. Example conditions where the Si-comprising precursor molecule is hexachlorodisilane are gas flow thereof of 100 to 1,000 sccm, substrate temperature of 550° C. to 630° C., and chamber pressure of 100 to 500 mTorr, with such decomposing and contacting occurring over a time period of 2 to 30 seconds. For dichlorosilane, example conditions are gas flow thereof of 100 to 1,000 sccm, substrate temperature of 600° C. to 700° C., and chamber pressure of 100 to 500 mTorr, with such decomposing and contacting occurring over a time period of 2 to 30 seconds. For trichlorosilane, example conditions are gas flow thereof of 100 to 1,000 sccm, substrate temperature of 500° C. to 600° C., and chamber pressure of 100 to 500 mTorr, with such decomposing and contacting occurring over a time period of 2 to 30 seconds. For silicon tetrachloride, example conditions are gas flow thereof of 100 to 1,000 sccm, substrate temperature of 600° C. to 700° C., and chamber pressure of 100 to 500 mTorr, with such decomposing and contacting occurring over a time period of 2 to 30 seconds.

Figure 4:
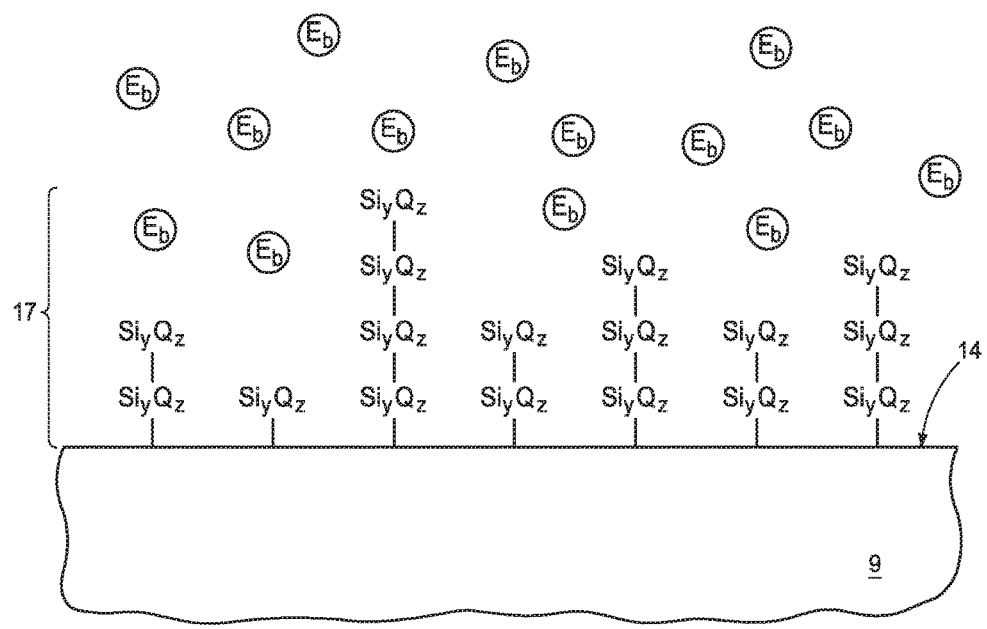
FIG. 4 is a view of the FIG. 3 substrate at a processing step subsequent to that shown by FIG. 3.

Attached species $Si_yQ_z$ may form essentially as a continuous layer 17 (as shown) atop surface 14 or alternately form as a discontinuous layer (not shown) atop surface 14. Ideally, at least one of the decomposition species that comprises Si also attaches to the attached species $Si_yQ_z$, for example as shown in FIG. 4 with respect to an example continuous layer 17 (although such may be discontinuous). FIG. 4, by way of example only, shows a diagrammatic example wherein some of decomposition species $Si_yQ_z$ has attached to previously-attached such species, including in some locations then further to itself, yet where not all of the initially-attached decomposition species have additionally-attached decomposition species $Si_yQ_z$ attached thereto. Regardless, a monolayer of attached species $Si_yQ_z$ may not result as is shown in FIG. 4 (a monolayer being shown in FIG. 3) whereby more attached species $Si_yQ_z$ that comprises silicon will form relative to outer substrate surface 14 as attached Si-comprising species that attaches to itself, thereby increasing quantity of Si ultimately attached relative to outer substrate surface 14.

Figure 5:
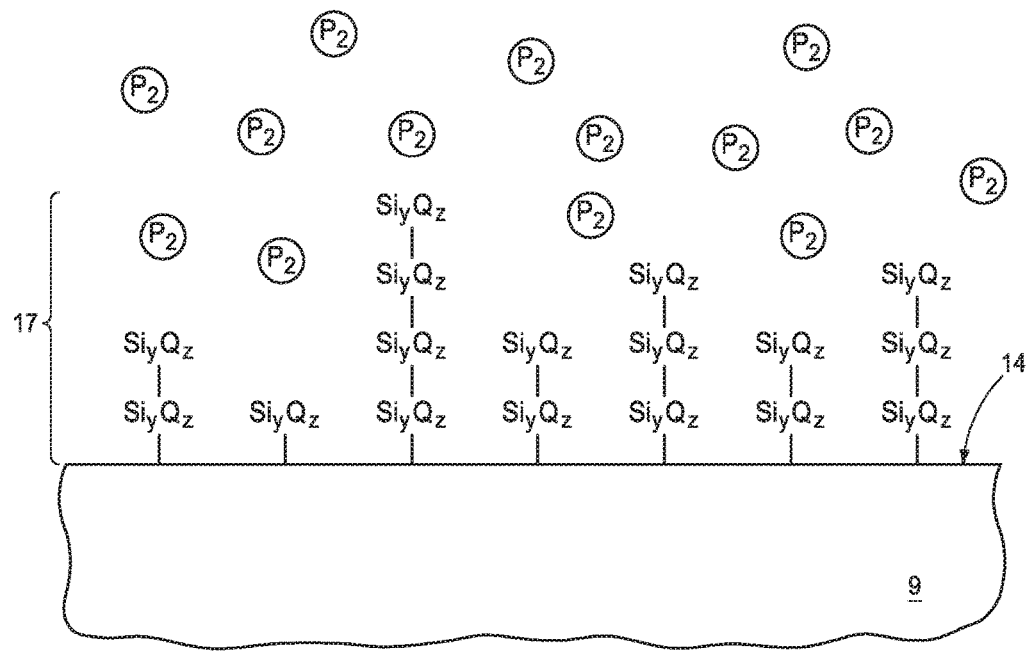
FIG. 5 is a view of the FIG. 4 substrate at a processing step subsequent to that shown by FIG. 4.
Figure 6:
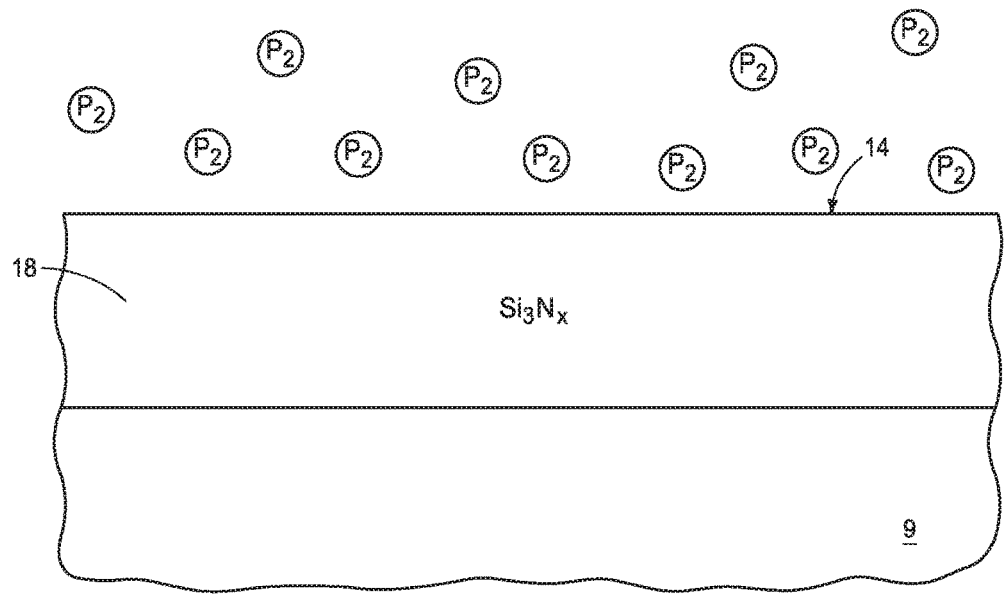
FIG. 6 is a view of the FIG. 5 substrate at a processing step subsequent to that shown by FIG. 5.

Referring to FIG. 5, attached species $Si_yQ_z$ is contacted with a. N-comprising precursor $P_2$ that reacts with attached species $Si_yQ_z$ to form a reaction product 18 (FIG. 6) comprising $Si_3N_x$ (and a new substrate outer surface 14), where "x" is less than 4 and at least 3. In one embodiment, "x" in reaction product 18 is at least 3.5, in one embodiment is no more than 3.90, and in one embodiment is 3.75. Reaction product 18 may form as a continuous layer (as shown) or as a discontinuous layer (not shown). An example N-comprising precursor $P_2$ is ammonia, with example conditions during the contacting and reacting of FIGS. 5 and 6 being ammonia $P_2$ gas flow of 100 to 1,000 sccm, substrate temperature of 500° C. to 650° C., chamber pressure of 1 to 10 Torr (with or without plasma), and with ammonia being fed to substrate 9 for 5 seconds to 1 minute. The sequence may be repeated one or more times as desired to achieve a desired thickness of $Si_3N_x$ material 18.

The respective Si-comprising precursor and N-comprising precursor are ideally evacuated from the chamber, for example by stopping flow of the respective precursor to such chamber and which may include flowing an inert gas to purge such from being in such chamber prior to any one or more subsequent processing acts. Regardless, in one embodiment. $N_2$ may be fed to the substrate surface whereby it contacts the outer substrate surface during at least one of the acts of contacting, and in one such embodiment occurs during both of said contactings (yet which may not result in any N therefrom being deposited as part of material 17 and/or material 18).

Embodiments of the invention enable formation of a silicon-rich silicon nitride (thereby not being stoichiometric $Si_3N_4$). For example, feeding and decomposing more Si-comprising precursor molecule $D_aE_b$ may result, at least to some degree, in greater quantity of silicon being attached to substrate 9 due to increased silicon in the attached species attaching to itself as opposed only to available initial sites of outer substrate surface 14.

$Si_3N_x$ as formed above may be used as insulator material, for example as insulator material that is ultimately between a control gate and charge-storage material of a programmable charge-storage transistor. In one embodiment, such a programmable charge-storage transistor is formed to be devotionally-extending, and in one such embodiment to be vertical or within 10° of vertical. In another embodiment, the programmable charge-storage transistor is formed to be horizontal or within 10° of horizontal. Regardless, the reaction product $Si_3N_x$ may be formed before or after forming either of the control-gate material and charge-storage material of the programmable charge-storage transistor.

Embodiments of the invention also encompass a method of forming an array of elevationally-extending strings of memory cells. An example such method is next described with reference to FIG. 7-13 wherein control-gate material is formed prior to forming $Si_3N_x$ as-described above.

Figure 7:
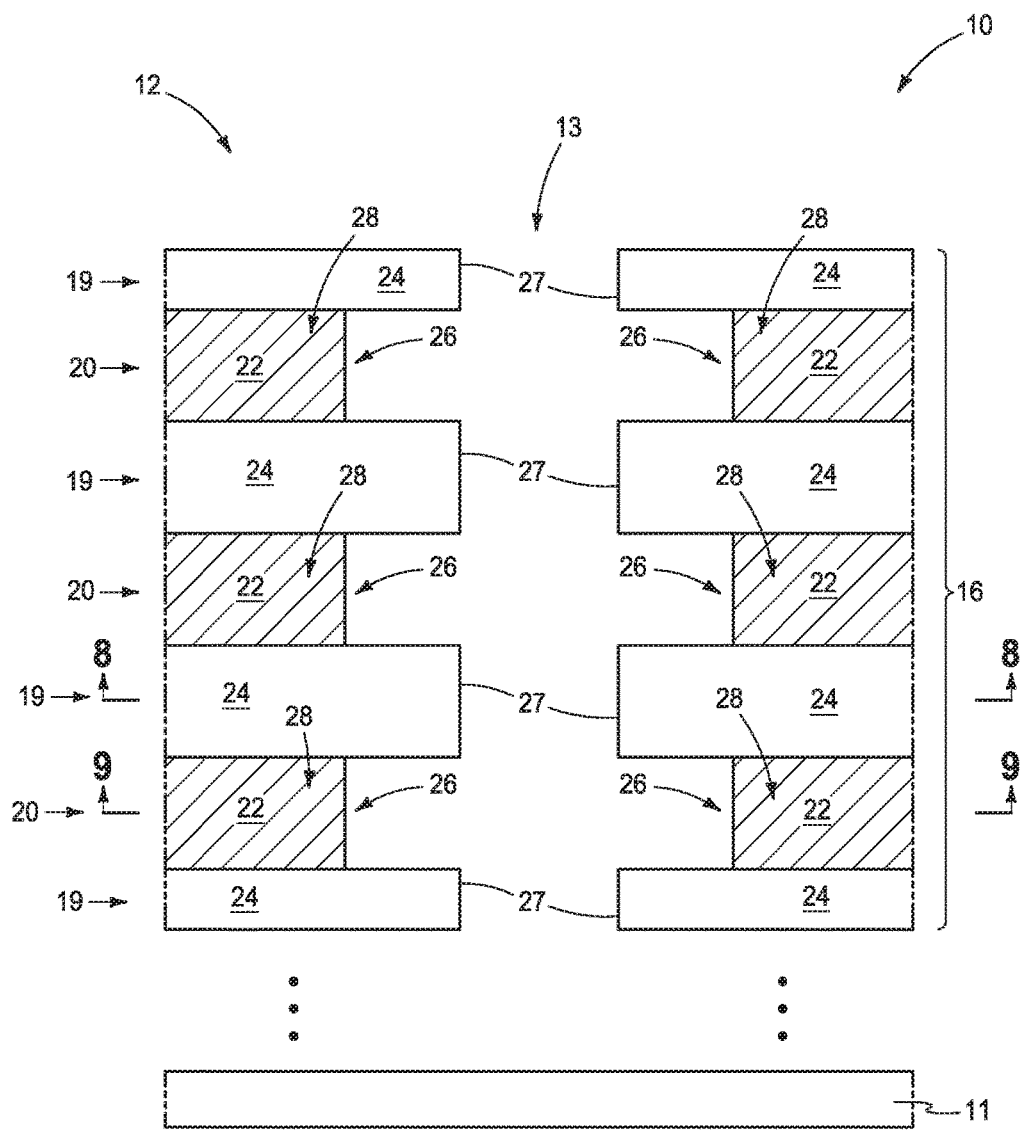
FIG. 7 is a diagrammatic cross-sectional view of a portion of a substrate in process in accordance with an embodiment of the invention.
Figure 8:
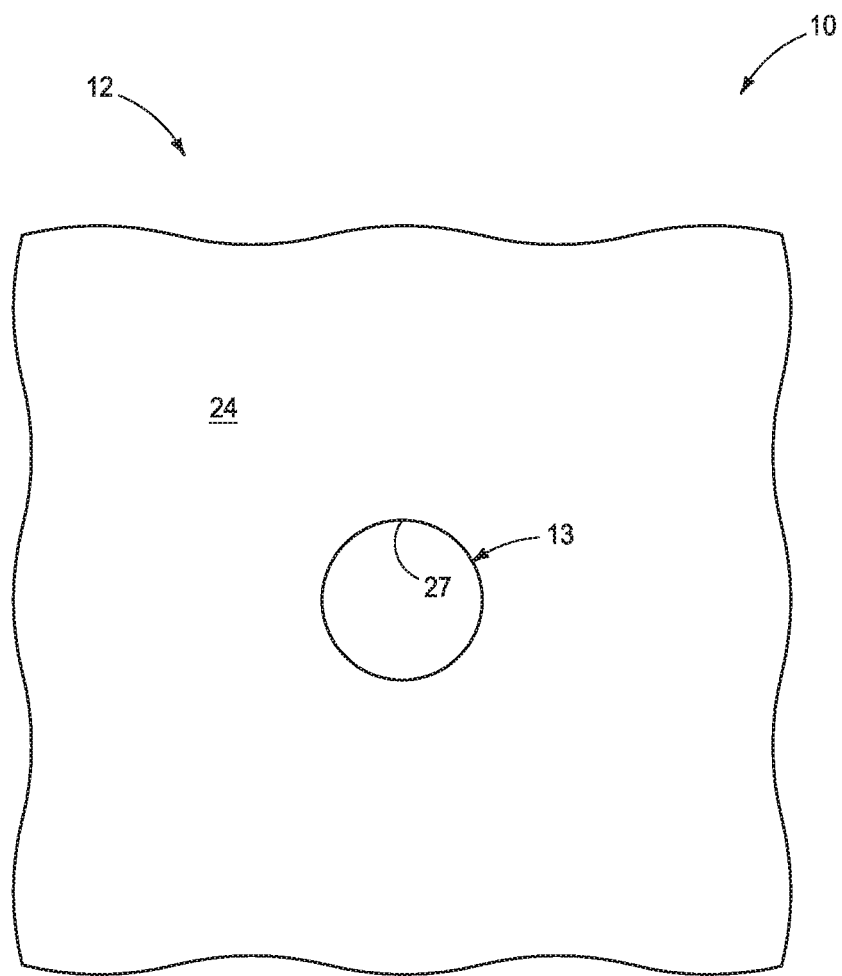
FIG. 8 is a view taken through line 8-8 in FIG. 7.
Figure 9:
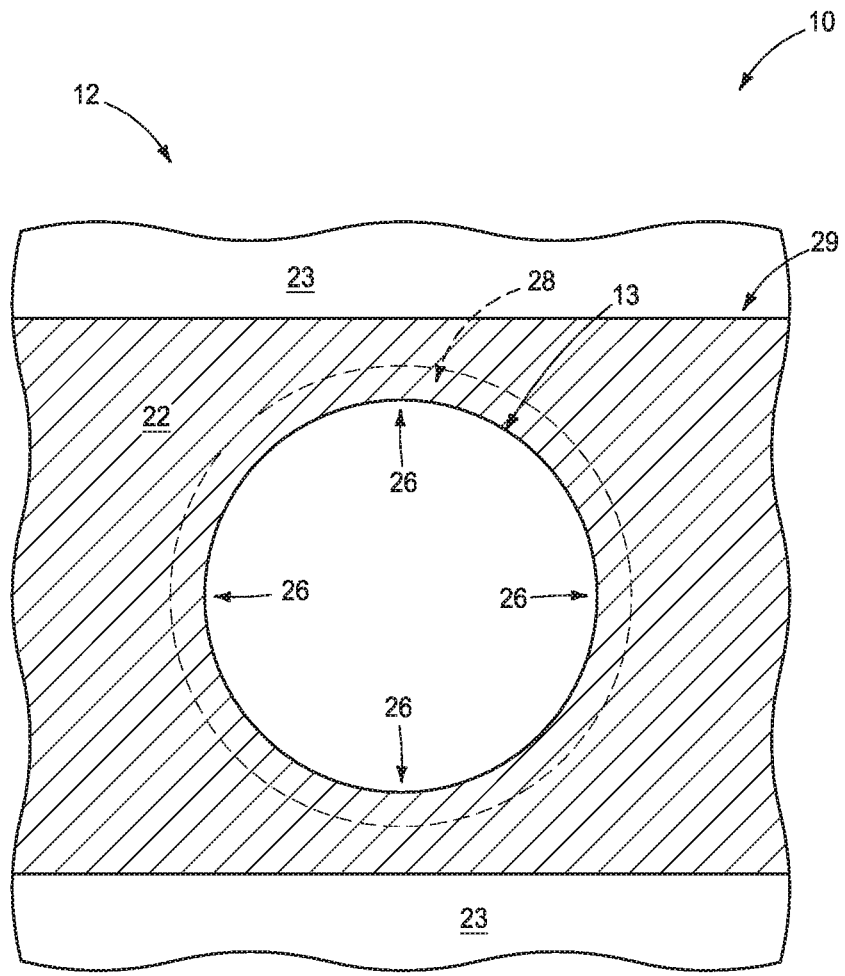
FIG. 9 is a view taken through line 9-9 in FIG. 7.

Referring to FIG. 7-9, a construction 10 that will be acted upon (i.e., processed) in accordance with an embodiment of the invention comprises a base substrate 11 that may include any one or more of conductive/conductor/conducting (i.e., electrically herein), semiconductive/semiconductor/semi-conducting, or insulative/insulator/insulating (i.e., electrically herein) materials. Various materials have been formed elevationally over base substrate 11. Materials may be aside, elevationally inward, or elevationally outward of the FIGS. 7-9—depicted materials. For example, other partially or wholly fabricated components of integrated circuitry may be provided somewhere above, about, or within base substrate 11. Control and/or other peripheral circuitry for operating components within an array of elevationally-extending strings of memory cells may also be fabricated, and may or may not be wholly or partially within such an array or sub-array. Further, multiple sub-arrays may also be fabricated and operated independently, in tandem, or otherwise relative one another. In this document, a "sub-array" may also be considered as an array.

Construction 10 comprises an array 12 of what will be elevationally-extending strings of memory cells. FIGS. 7-13 show fabrication of only a single string with, however, likely hundreds, thousands, tens of thousands, etc. of such strings being included in array 12. Array 12 comprises a vertical stack 16 of alternating insulative tiers 19 and wordline tiers 20. Example tiers 20 comprise conductive control-gate material 22. Examples include elemental metals (e.g., tungsten, titanium, copper, etc.), metal material (e.g., metal nitrides, metal silicides, metal carbides, etc.), and conductively-doped-semiconductive materials (e.g., silicon, gallium, etc.), including mixtures thereof. Example tiers 19 comprise insulative material 24 (e.g., doped or undoped silicon dioxide). Array 12 is shown as having seven vertically-alternating tiers 19, 20 in FIG. 7, although fewer or likely many more (e.g., dozens, hundreds etc.) may be formed. Accordingly, more tiers 19 and 20 may be above and/or below the depicted tiers. Tiers 19 and 20 may be of any suitable vertical thickness(es) and may have the same or different vertical thickness(es) relative one another. As an example, tiers 19 and 20 may have respective thicknesses of about 10 nanometers (nm) to 300 nm.

Control-gate material 22 has terminal ends 26 corresponding to control-gate regions 28 of the individual memory cells being formed. Control-gate regions 28 may be part of individual control-gate lines 29 (only one being shown and numerically designated in FIG. 9) that interconnect multiple memory cells of multiple strings of memory cells being formed within individual wordline tiers 20 in a row direction. Dielectric material 23 (FIG. 9; e.g., silicon dioxide and/or silicon nitride) is laterally between control-gate lines 29.

Channel openings 13 extend through alternating tiers 19, 20, with only one channel opening 13 being shown with respect to fabrication of a single elevationally-extending string of memory cells. Channel openings 13 may be considered as comprising laterally-innermost (e.g., radially-innermost) surfaces 27, with in one embodiment control-gate material 22 having been laterally-recessed there-from (e.g., by selective wet or dry etching of material 22 relative to material 24).

Figure 10:
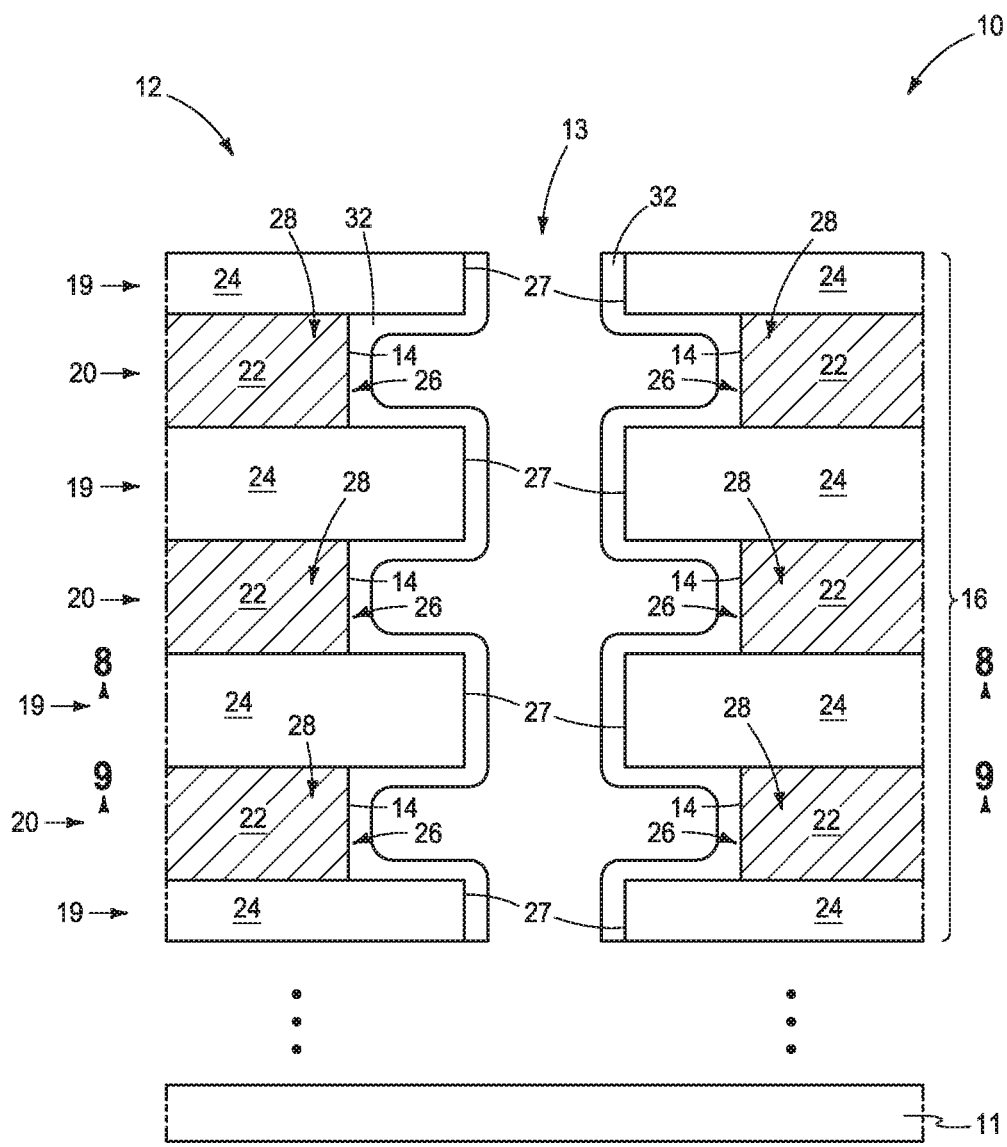
FIG. 10 is a view of the FIG. 7 substrate at a processing step subsequent to that shown by FIG. 7.

Referring to FIG. 10, charge-blocking material 32 (i.e., a charge block) comprising $Si_3N_x$ has been formed elevationally along laterally-recessed control-gate material 22. Formation of such $Si_3N_x$ is conducted in accordance with the above-described example methods involving, as a minimum, decomposing a Si-comprising precursor molecule into at least two decomposition species that are different from one another, with at least one of the at least two different composition species comprising Si. An outer substrate surface is contacted with the at least two decomposition species, with at least one of the decomposition species that comprises Si attaching to the outer substrate surface to comprise an attached species. The attached species is contacted with a N-comprising precursor that reacts with the attached species to form a reaction product comprising $Si_3N_x$, where "x" is less than 4 and at least 3. Material 32 may be a composite of different composition layers, for example oxide-nitride-oxide, where the "nitride" is $Si_3N_x$ deposited in accordance with a method embodiment of the invention (e.g., directly against an outer surface of the initially-formed oxide). In one embodiment, the outer substrate surface (e.g., 14) comprises laterally-recessed control-gate material 22 and the $Si_3N_x$.

Figure 11:
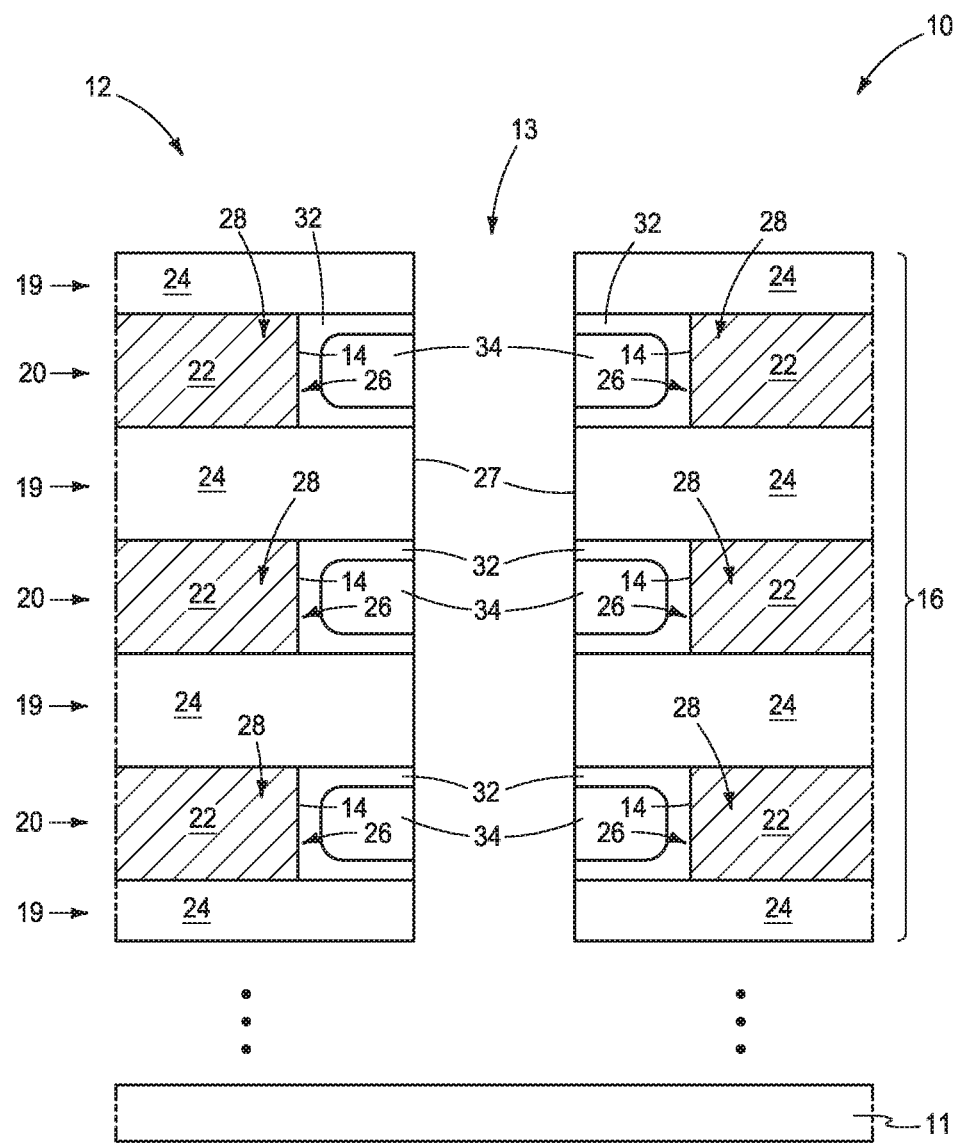
FIG. 11 is a view of the FIG. 10 substrate at a processing step subsequent to that shown by FIG. 10.

Referring to FIG. 11, charge-storage material 34 has been formed within channel openings 13 elevationally along charge-blocking material 32 that comprises $Si_3N_x$. Charge-storage material 34 may comprise any suitable composition(s) and, in some embodiments, may comprise floating gate material (e.g., doped or undoped silicon) or charge-trapping material (e.g., silicon nitride, metal dots, etc.). Materials 32 and 34 are shown as having been subsequently removed from being laterally over laterally-innermost surfaces 27 of channel openings 13.

A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. An example thickness of charge-blocking material 32 that comprises $Si_3N_x$ is 25 to 80 Angstroms.

Figure 12:
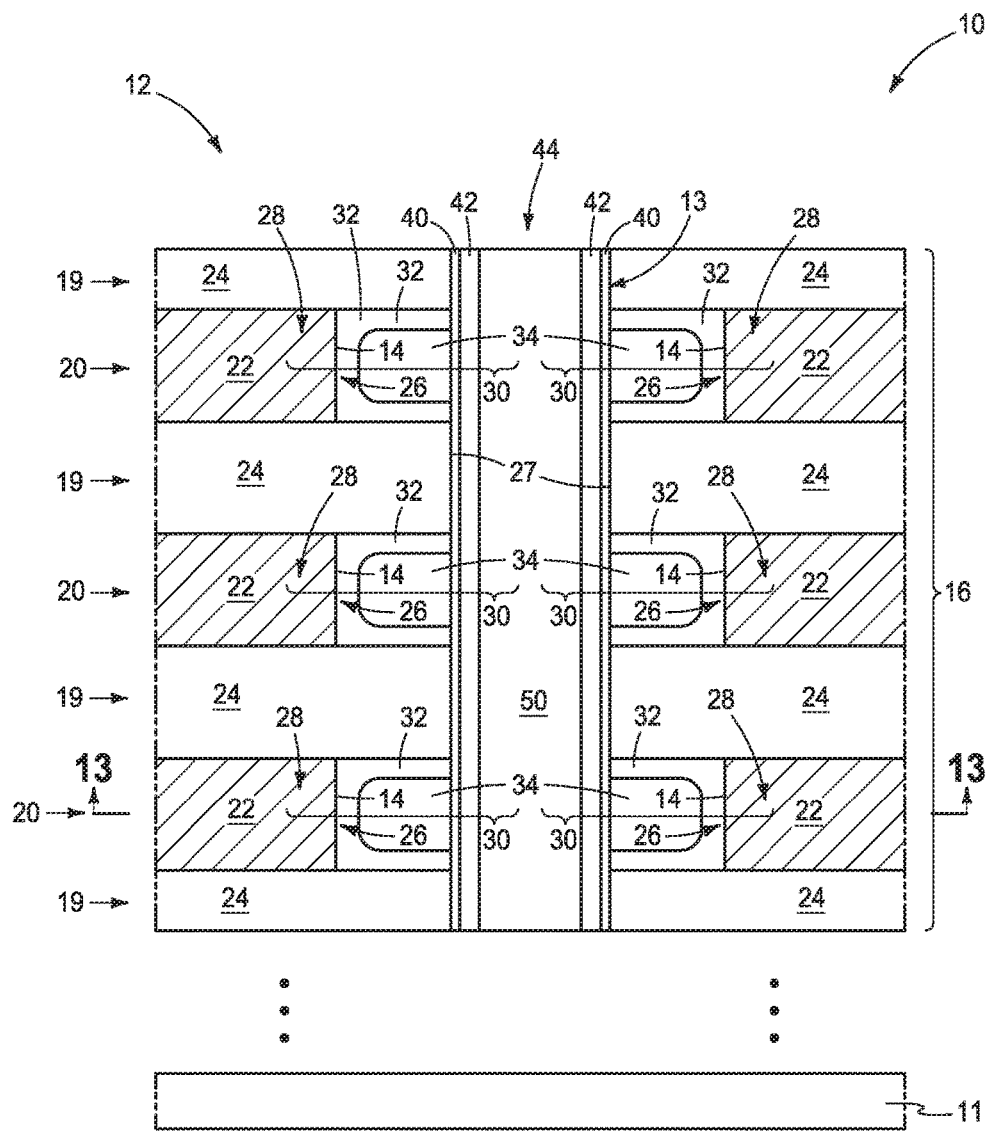
FIG. 12 is a view of the FIG. 11 substrate at a processing step subsequent to that shown by FIG. 11, and of structure in accordance with an embodiment of the invention.
Figure 13:
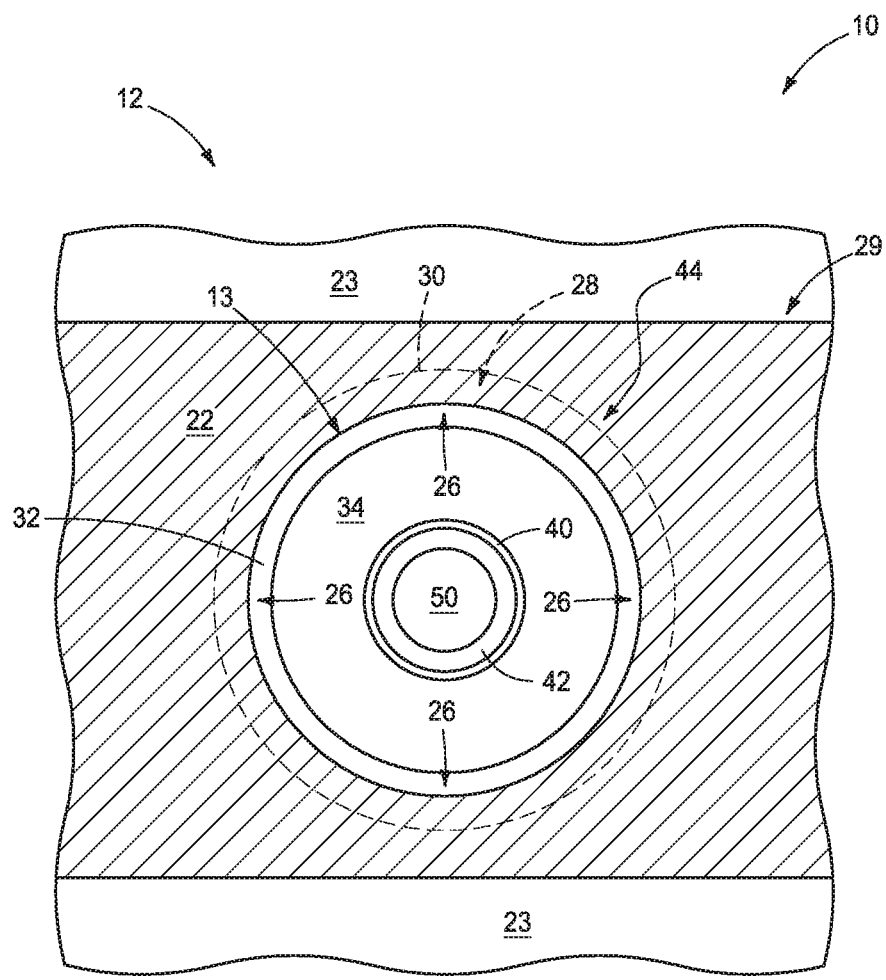
FIG. 13 is a view taken through line 13-13 in FIG. 12.

Referring to FIGS. 12 and 13, insulative charge-passage material 40 then transistor channel material 42 have been formed in channel openings 13 laterally over charge-storage material 34, thereby forming an elevationally-extending string 44 of individual memory cells 30. Approximate locations of memory cells 30 are indicated with brackets in FIG. 12 and with a dashed outline in FIG. 13, with memory cells 30 being essentially ring-like or annular in the depicted example. Charge-passage material 40 may be, by way of example, a bandgap-engineered structure having nitrogen-containing material (e.g., silicon nitride) sandwiched between two insulator oxides (e.g., silicon dioxide). An example thickness is 25 to 80 Angstroms. Example channel materials 42 include appropriately-doped crystalline semiconductor material, such as one or more of silicon, germanium, and so-called HUNT semiconductor materials (e.g., GaAs, InP, GaP, and GaN). Example memory cell string 44 is shown as comprising a radially-central solid dielectric material 50 (e.g., spin-on-dielectric, silicon dioxide, and/or silicon nitride). Alternately, and by way of example only, the radially-central portion of memory cell string 44 may include void space(s) (not shown) and/or be devoid of solid material (not shown). Alternate existing or yet-to-be developed constructions may be used. For example, multiple memory cells may be formed about a single string in an individual wordline tier 20, for example by bifurcating the FIG. 13—depicted control-gate line 29 longitudinally down its middle (not shown) thus creating two memory cells (not shown) that may be separately controlled if such bifurcated control-gate lines are separately controllable.

Any other attribute(s) or aspect(s) as shown and/or described herein with respect to other embodiments may be used.

Figure 14:
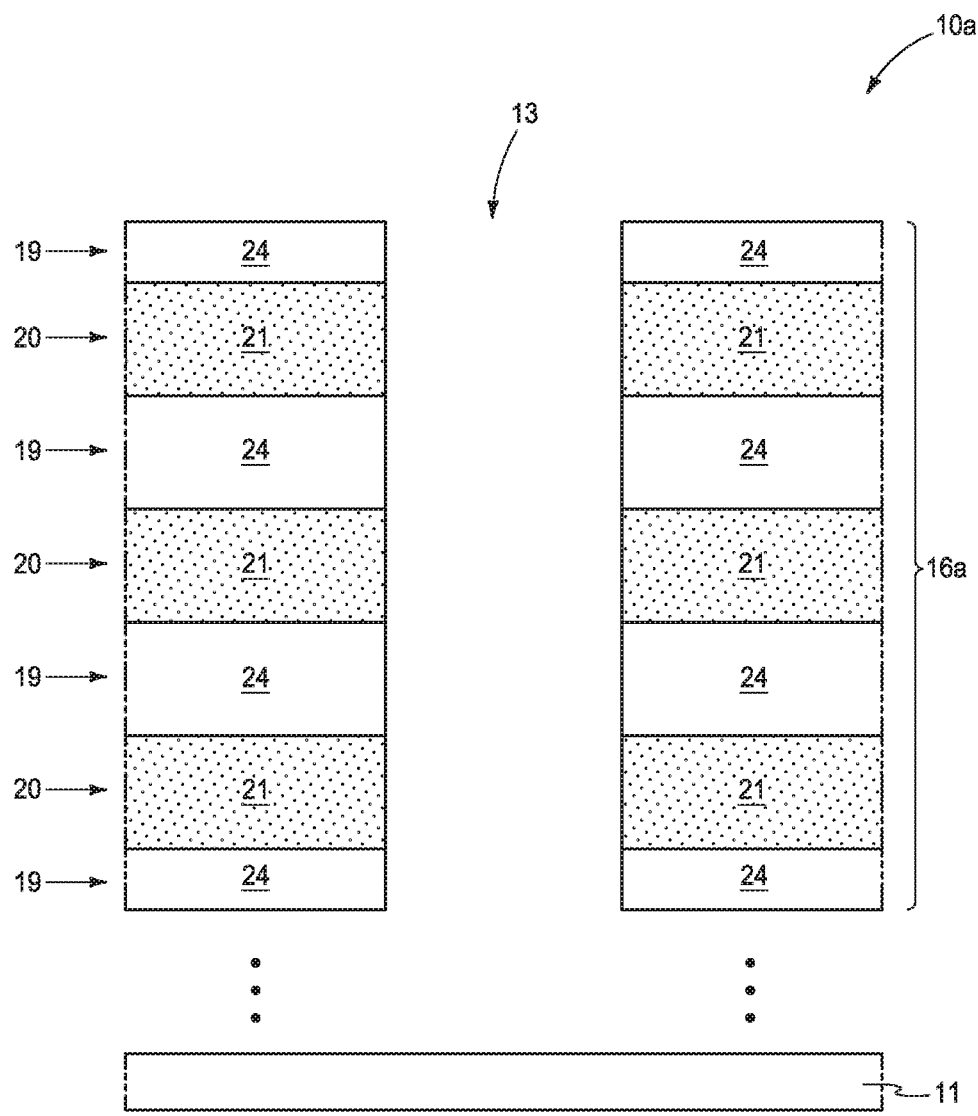
FIG. 14 is a diagrammatic cross-sectional view of a portion of a substrate in process in accordance with an embodiment of the invention.

Another method of forming an array of elevationally-extending strings of memory cells is next-described with reference to FIGS. 14-17 with respect to a construction 10a. Like numerals from the above-described embodiments have been used where appropriate, with some construction differences being indicated with suffix "a" or with different numerals. Referring to FIG. 14, a stack 16a comprising vertically-alternating tiers 19, 20 of different composition first material 24 and second material 21 has been formed. First material 24 is insulative (e.g., silicon dioxide). An example second material is silicon nitride, and which may be wholly or partially sacrificial. Elevationally-extending channel openings 13 have been formed into alternating tiers 19, 20.

Figure 15:
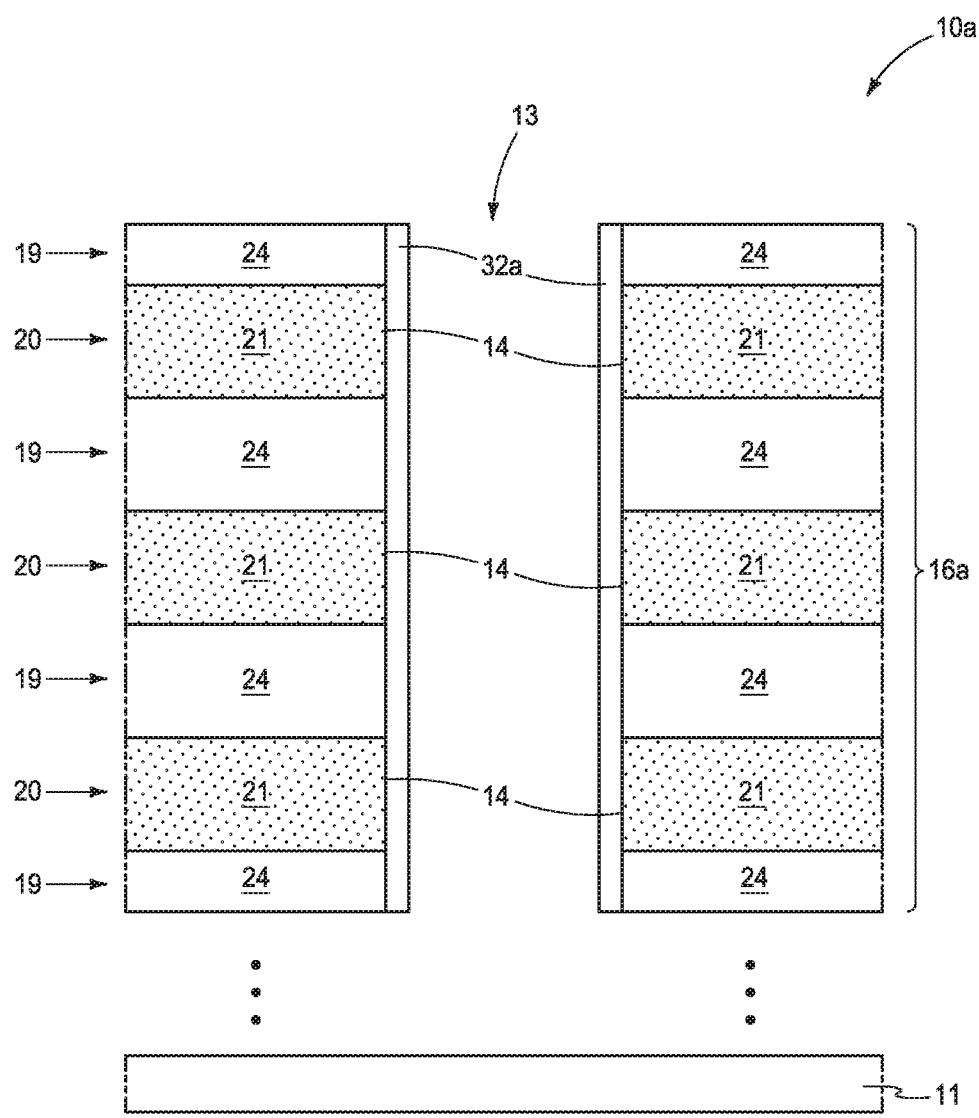
FIG. 15 is a view of the FIG. 14 substrate at a processing step subsequent to that shown by FIG. 14.

Referring to FIG. 15, charge-blocking material 32a that comprises $Si_3N_x$ has been formed in channel openings 13 elevationally along alternating tiers 19, 20. The forming of the $Si_3N_x$ is conducted in accordance with the embodiments described above with respect to FIGS. 7-13. Again, such will involve, as a minimum, decomposing a Si-comprising precursor molecule into at least two decomposition species that are different from one another, with at least one of the at least two different composition species comprising Si. An outer substrate surface is contacted with the at least two decomposition species, with at least one of the decomposition species that comprises Si attaching to the outer substrate surface to comprise an attached species. In one embodiment and as shown, the outer substrate surface (e.g., 14) comprises second material 21 and the $Si_3N_x$ of charge-blocking material 32 is formed directly against second material 21. The attached species is contacted with a N-comprising precursor the reacts with the attached species to form a reaction product comprising $Si_3N_x$, where "x" is less 4 and at least 3.

Figure 16:
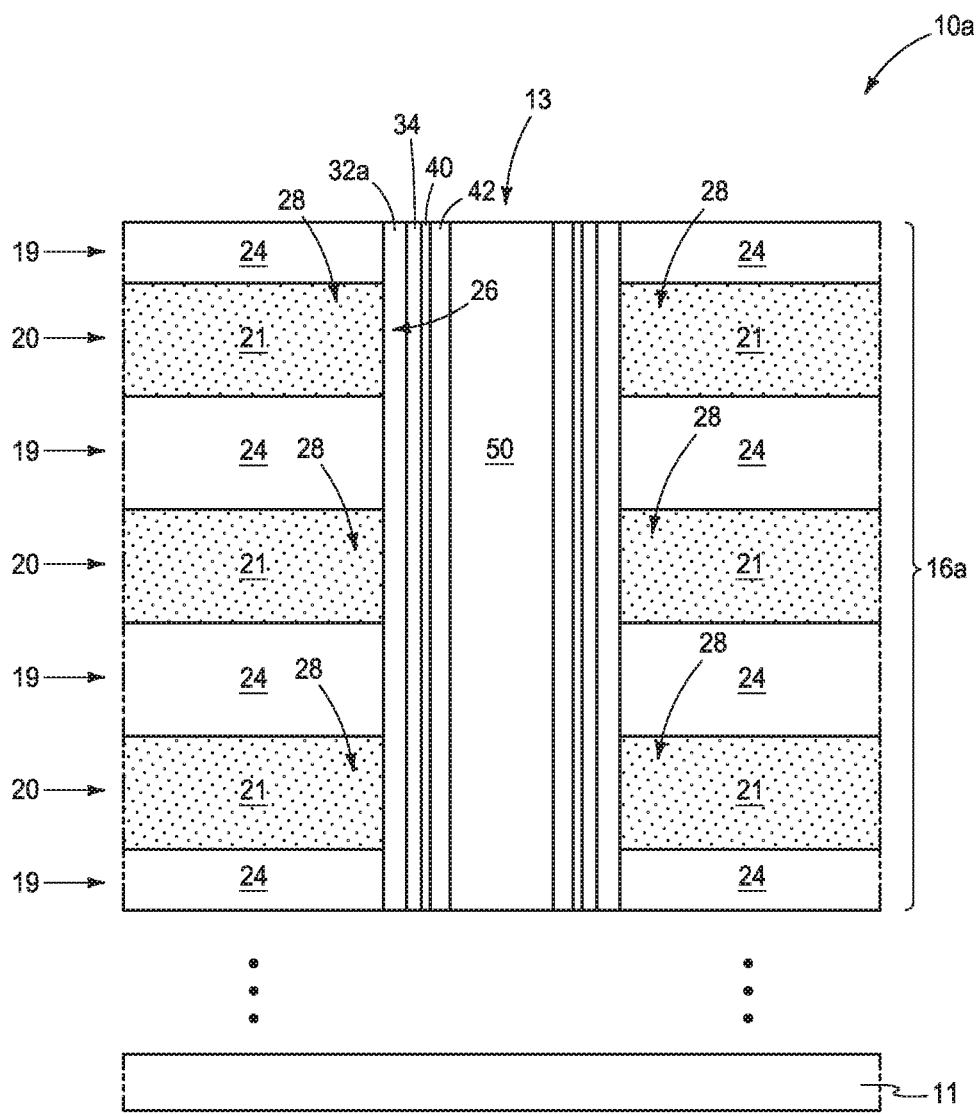
FIG. 16 is a view of the FIG. 15 substrate at a processing step subsequent to that shown by FIG. 15.

Referring to FIG. 16, charge-storage material 34 has been formed in channel openings 13 elevationally along alternating tiers 19, 20 and the $Si_3N_x$ of charge-blocking material 32a. Insulative charge-passage material 40 has been formed in channel openings 13 elevationally along charge-storage material 34. Transistor channel material 42 has been formed in channel openings 13 elevationally along insulative charge-passage material 40, followed by formation of dielectric material 50.

Figure 17:
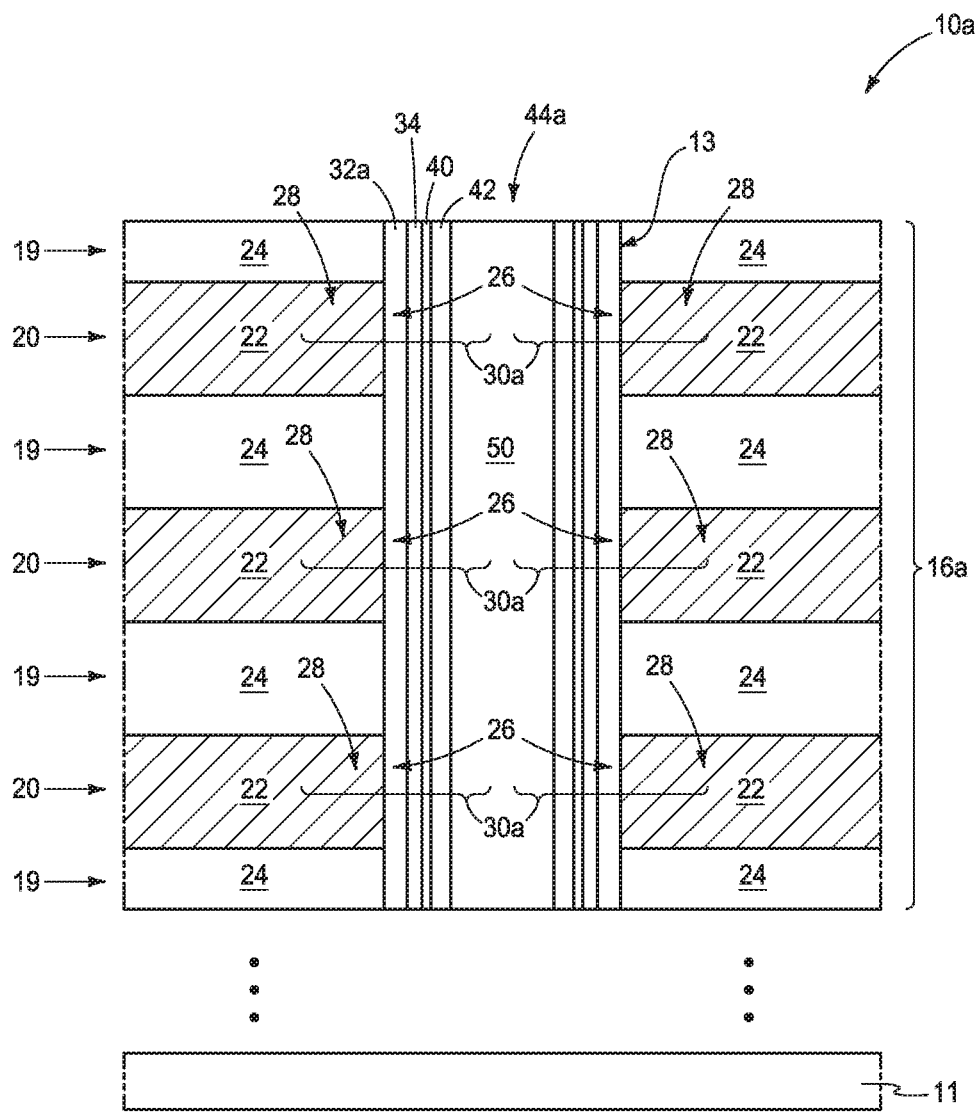
FIG. 17 is a view of the FIG. 16 substrate at a processing step subsequent to that shown by FIG. 16, and of structure in accordance with an embodiment of the invention.

Referring to FIG. 17, and after forming transistor channel material 42, at least some of second material 21 (in one embodiment all, with thereby none of second material 21 being shown in FIG. 17) has been replaced with control-gate material 22 having terminal ends 26 corresponding to control-gate regions 28 of individual memory cells 30a of an elevationally extending memory cell string 44a. In one embodiment, control-gate material 22 is formed directly against the $Si_3N_x$ of charge-blocking material 32a.

Any other attribute(s) or aspect(s) as shown and/or described herein with respect to other embodiments may be used.

Embodiments of the invention comprise programmable charge-storage transistors manufactured in accordance with the above techniques, and include for example an array of elevationally-extending strings of memory cells. Embodiments of the invention also encompass a programmable charge-storage transistor (which may be part of an elevationally-extending string of memory cells or of another array of memory cells) independent of method of manufacture. Such a transistor comprises channel material (e.g., 42), insulative charge-passage material (e.g., 40), charge-storage material (e.g., 36, 36a), and a control-gate (e.g., 28). A charge-blocking insulator material (e.g., 32, 32a) is between the charge-storage material and the control gate. The charge-blocking insulator material comprises $Si_3N_x$, where "x" is less than 4 and at least 3. Any other attribute(s) or aspect(s) as shown and/or described herein with respect to other embodiments may be used.

Provision of silicon-rich $Si_3N_x$ (thereby not being stoichiometric $Si_3N_4$) results in silicon dangling bonds which may lead to a greater ability to trap electrons (i.e., referring to in the silicon-rich $Si_3N_x$, and not referring to in the charge-storage material). Such may enable greater programming and erase voltages to be applied to the control gate, with such trapped electrons in the silicon-rich $Si_3N_x$ helping to block current leakage whereby larger voltages can be applied thereby increasing the programming and erase windows.

The above-described processing and example embodiments depict example elevationally-extending transistors, which in one embodiment are vertical or within 10° of vertical. Embodiments of the invention also comprise transistors that are horizontal or within 10° of horizontal. In one embodiment, an array of elevationally-extending strings of memory cells is contemplated, with such memory cells individually comprising the programmable charge-storage transistor. Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

In this document, "selective" as to etch, etching, removing, removal, forming, and/or formation is such an act of one stated material relative to another stated material(s) so acted upon at a rate of at least 2:1 by volume.

CONCLUSION

In some embodiments, a method of forming $Si_3N_x$, where "x" is less than 4 and at least 3, comprises decomposing a Si-comprising precursor molecule into at least two decomposition species that are different from one another, at least one of the at least two different decomposition species comprising Si. An outer substrate surface is contacted with the at least two decomposition species. At least one of the decomposition species that comprises Si attaches to the outer substrate surface to comprise an attached species. The attached species is contacted with a N-comprising precursor that reacts with the attached species to form a reaction product comprising $Si_3N_x$, where "x" is less than 4 and at least 3.

In some embodiments, a method of forming $Si_3N_x$, where "x" is less than 4 and at least 3, comprises decomposing a silicon and chlorine-comprising precursor molecule into at least two decomposition species that are different from one another. At least one of the at least two different decomposition species comprises Si. The decomposing comprises thermal decomposition of the silicon and chlorine-comprising precursor molecule directly above an outer substrate surface at a temperature of at least 500° C. The outer substrate surface is contacted with the at least two decomposition species. At least one of the decomposition species that comprises Si attaches to the outer substrate surface to comprise an attached species and the at least one of the decomposition species that comprises Si is attached to the attached species. The attached species is contacted with ammonia that reacts with the attached species to form a reaction product comprising $Si_3N_x$, where "x" no more than 3.90 and at least 3.

In some embodiments, a method of forming insulator material that is ultimately between a control gate and charge-storage material of a programmable charge-storage transistor comprises decomposing a Si-comprising precursor molecule into at least two decomposition species that are different from one another. At least one of the at least two different decomposition species comprises Si. An outer substrate surface is contacted with the at least two decomposition species. At least one of the decomposition species that comprises Si attaches to the outer substrate surface to comprise an attached species. The attached species is contacted with a N-comprising precursor that reacts with the attached species to form a reaction product comprising $Si_3N_x$, where "x" is less than 4 and at least 3. The reaction product is provided between a control gate and charge-storage material of a programmable charge-storage transistor.

In some embodiments, a method of forming an array of elevationally-extending strings of memory cells comprises forming a stack comprising vertically-alternating insulative tiers and wordline tiers. The wordline tiers comprise control-gate material having terminal ends corresponding to control-gate regions of individual memory cells. Channel openings extend into the alternating tiers. The control-gate material is laterally-recessed from laterally-innermost surfaces of the channel openings. Charge-blocking material comprising $Si_3N_x$, where "x" is less than 4 and at least 3, is formed in the channel openings elevationally along the laterally-recessed control-gate material. The forming of the $Si_3N_x$ comprises decomposing a Si-comprising precursor molecule into at least two decomposition species that are different from one another. At least one of the at least two different decomposition species comprises Si. An outer substrate surface is contacted with the at least two decomposition species. At least one of the decomposition species that comprises Si attaches to the outer substrate surface to comprise an attached species. The attached species is contacted with a N-comprising precursor that reacts with the attached species to form a reaction product comprising $Si_3N_x$, where "x" is less than 4 and at least 3. Charge-storage material is formed in the channel openings elevationally along the charge-blocking material comprising $Si_3N_x$. Insulative charge-passage material then transistor channel material are formed in the channel openings laterally over the charge-storage material.

In some embodiments, a method of forming an array of elevationally-extending strings of memory cells comprises forming a stack comprising vertically-alternating insulative tiers and wordline tiers. Channel openings extend into the alternating tiers. The wordline tiers comprise control-gate material (regardless of whether being laterally-recessed from laterally-innermost surfaces of the channel openings). Charge-blocking material comprising $Si_3N_x$, where "x" is less than 4 and at least 3, is formed in the channel openings elevationally along the control-gate material. The forming of the $Si_3N_x$ comprises decomposing a Si-comprising precursor molecule into at least two decomposition species that are different from one another. At least one of the at least two different decomposition species comprises Si. An outer substrate surface is contacted with the at least two decomposition species. At least one of the decomposition species that comprises Si attaches to the outer substrate surface to comprise an attached species. The attached species is contacted with a N-comprising precursor that reacts with the attached species to form a reaction product comprising $Si_3N_x$, where "x" is less than 4 and at least 3. Charge-storage material is formed in the channel openings elevationally along the charge-blocking material comprising $Si_3N_x$. Insulative charge-passage material then transistor channel material are formed in the channel openings laterally over the charge-storage material. The control-gate material is provided to have terminal ends corresponding to control-gate regions of individual memory cells, with the charge-blocking material being between the charge-storage material and individual of the control-gate regions.

In some embodiments, a method of forming an array of elevationally-extending strings of memory cells comprises forming a stack comprising vertically-alternating tiers of different composition first and second materials. The first material is insulative. Elevationally-extending channel openings are formed into the alternating tiers. Charge-blocking material comprising $Si_3N_x$, where "x" is less than 4 and at least 3, is formed in the channel openings elevationally along the alternating tiers. The forming of the $Si_3N_x$ comprises decomposing a Si-comprising precursor molecule into at least two decomposition species that are different from one another. At least one of the at least two different decomposition species comprises Si. An outer substrate surface is contacted with the at least two decomposition species. At least one of the decomposition species that comprises Si attaches to the outer substrate surface to comprise an attached species. The attached species is contacted with a N-comprising precursor that reacts with the attached species to form a reaction product comprising $Si_3N_x$ where "x" is less than 4 and at least 3. Charge-storage material is formed in the channel openings elevationally along the alternating tiers and the charge-blocking material comprising $Si_3N_x$. Insulative charge-passage material is formed in the channel openings elevationally along the charge-storage material. Transistor channel material is formed in the channel openings elevationally along the insulative charge-passage material. After forming the transistor channel material, at least some of the second material is replaced with control-gate material having terminal ends corresponding to control-gate regions of individual memory cells.

In some embodiments, a programmable charge-storage transistor comprises channel material, insulative charge-passage material, charge-storage material, and a control gate. Charge-blocking insulator material is between the charge-storage material and the control gate. The charge-blocking insulator material comprises $Si_3N_x$, where "x" is less than 4 and at least 3.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming $Si_3N_x$, where "x" is less than 4 and at least 3, comprising:
   decomposing a Si-comprising precursor molecule into at least two decomposition species that are different from one another within a chamber having a chamber pressure of from 100 to 500 mTorr, at least one of the at least two different decomposition species comprising Si;
   after the decomposing the Si-precursor molecule, contacting an outer substrate surface with the at least two decomposition species, at least one of the decomposition species that comprises Si attaching to the outer substrate surface to comprise an attached species; and
   after the contacting the outer substrate surface, contacting the attached species with a N-comprising precursor that reacts with the attached species to form a reaction product comprising $Si_3N_x$, where "x" is less than 4 and at least 3.

2. The method of claim 1 wherein the decomposing comprises thermal decomposition of the Si-comprising precursor molecule and at a temperature of at least 500° C.

3. The method of claim 2 wherein the decomposing consists essentially of thermal decomposition.

4. The method of claim 1 comprising attaching the at least one of the decomposition species that comprises Si to the attached species.

5. The method of claim 1 wherein the decomposing occurs directly above the outer substrate surface.

6. The method of claim 1 comprising repeating said sequence.

7. The method of claim 1 wherein the Si-comprising precursor molecule comprises a silane.

8. The method of claim 7 wherein the silane comprises a chlorosilane.

9. The method of claim 1 wherein the N-comprising precursor comprises ammonia.

10. The method of claim 1 comprising during at least one of said contactings also contacting the outer substrate surface with $N_2$.

11. The method of claim 10 comprising contacting the outer substrate surface with $N_2$ during both of said contactings.

12. The method of claim 1 wherein "x" in the reaction product is at least 3.5.

13. The method of claim 1 wherein "x" in the reaction product is no more than 3.90.

14. The method of claim 1 wherein "x" in the reaction product is 3.75.

15. The method of claim 1 wherein only one of all said different decomposition species comprises Si.

16. The method of claim 1 wherein the decomposing and the contacting of the outer substrate surface with the at least two decomposition species occur in the deposition chamber under identical the temperature and pressure conditions.

17. A method of forming $Si_3N_x$, where "x" is less than 4 and at least 3, comprising:
   decomposing silicon tetrachloride into at least two decomposition species that are different from one another, at least one of the at least two different decomposition species comprising Si;
   after the decomposing the Si-precursor molecule, contacting an outer substrate surface with the at least two decomposition species, at least one of the decomposition species that comprises Si attaching to the outer substrate surface to comprise an attached species; and
   after the contacting the outer substrate surface, contacting the attached species with a N-comprising precursor that reacts with the attached species to form a reaction product comprising $Si_3N_x$, where "x" is less than 4 and at least 3.

18. A method of forming $Si_3N_x$, where "x" is less than 4 and at least 3, comprising:
   providing a single Si-comprising precursor into a chamber;
   decomposing the single Si-comprising precursor into at least two decomposition species that are different from one another, wherein each of at least two of said different decomposition species comprises Si;
   after the decomposing the Si-precursor molecule, contacting an outer substrate surface with the at least two decomposition species, at least one of the decomposition species that comprises Si attaching to the outer substrate surface to comprise an attached species; and
   after the contacting the outer substrate surface, contacting the attached species with a N-comprising precursor that reacts with the attached species to form a reaction product comprising $Si_3N_x$, where "x" is less than 4 and at least 3.

19. A method of forming $Si_3N_x$, where "x" is less than 4 and at least 3, comprising:
   providing a single silicon- and chlorine-comprising precursor into a chamber, the single silicon- and chlorine-comprising precursor being selected from silicon tetrachloride, hexachlorodisilane and trichlorosilane;
   decomposing the silicon- and chlorine-comprising precursor molecule into at least two decomposition species that are different from one another, at least one of the at least two different decomposition species comprising Si, the decomposing comprising thermal decomposition of the silicon- and chlorine-comprising precursor molecule directly above an outer substrate surface at a temperature of at least 500° C.;

contacting the outer substrate surface with the at least two decomposition species, at least one of the decomposition species that comprises Si attaching to the outer substrate surface to comprise an attached species and attaching the at least one of the decomposition species that comprises Si to the attached species; and after contacting the outer substrate surface with the at least two decomposition species, contacting the attached species with ammonia that reacts with the attached species to form a reaction product comprising $Si_3N_x$, where "x" no more than 3.90 and at least 3.

20. A method of forming insulator material that is ultimately between a control gate and charge-storage material of a programmable charge-storage transistor, comprising:

decomposing a Si-comprising precursor molecule into at least two decomposition species that are different from one another, at least one of the at least two different decomposition species comprising Si;

contacting an outer substrate surface with the at least two decomposition species, at least one of the decomposition species that comprises Si attaching to the outer substrate surface to comprise an attached species;

contacting the attached species with a N-comprising precursor that reacts with the attached species to form a reaction product comprising $Si_3N_x$, where "x" is less than 4 and at least 3; and providing the reaction product between a control gate and charge-storage material of a programmable charge-storage transistor.

21. The method of claim 20 comprising forming the programmable charge-storage transistor to be elevationally extending.

22. The method of claim 21 comprising forming the programmable charge-storage transistor to be vertical or within 10° of vertical.

23. The method of claim 20 comprising forming the programmable charge-storage transistor to be horizontal or within 10° of horizontal.

24. A programmable charge-storage transistor produced by the method of claim 20.

25. A method of forming an array of elevationally-extending strings of memory cells, the method comprising:

forming a stack comprising vertically-alternating insulative tiers and wordline tiers, the wordline tiers comprising control-gate material, channel openings extending into the alternating tiers;

forming charge-blocking material comprising $Si_3N_x$, where "x" is less than 4 and at least 3, in the channel openings elevationally along the control-gate material, the forming of the $Si_3N_x$ comprising:

decomposing a Si-comprising precursor molecule into at least two decomposition species that are different from one another, at least one of the at least two different decomposition species comprising Si;

contacting an outer substrate surface with the at least two decomposition species, at least one of the decomposition species that comprises Si attaching to the outer substrate surface to comprise an attached species; and after the contacting the outer substrate surface with the at least two decomposition species, contacting the attached species with a N-comprising precursor that reacts with the attached species to form a reaction product comprising $Si_3N_x$, where "x" is less than 4 and at least 3;

forming charge-storage material in the channel openings elevationally along the charge-blocking material comprising $Si_3N_x$; and forming insulative charge-passage material then transistor channel material in the channel openings laterally over the charge-storage material;

providing the control-gate material to have terminal ends corresponding to control-gate regions of individual memory cells, with the charge-blocking material being between the charge-storage material and individual of the control-gate regions.

26. A method of forming an array of elevationally-extending strings of memory cells, the method comprising:

forming a stack comprising vertically-alternating insulative tiers and wordline tiers, the wordline tiers comprising control-gate material having terminal ends corresponding to control-gate regions of individual memory cells, channel openings extending into the alternating tiers, the control-gate material being laterally-recessed from laterally-innermost surfaces of the channel openings;

forming charge-blocking material comprising $Si_3N_x$, where "x" is less than 4 and at least 3, in the channel openings elevationally along the laterally-recessed control-gate material, the forming of the $Si_3N_x$ comprising:

decomposing a Si-comprising precursor molecule into at least two decomposition species that are different from one another, at least one of the at least two different decomposition species comprising Si;

contacting an outer substrate surface with the at least two decomposition species, at least one of the decomposition species that comprises Si attaching to the outer substrate surface to comprise an attached species; and after the contacting an outer substrate surface with the at least two decomposition species, contacting the attached species with a N-comprising precursor that reacts with the attached species to form a reaction product comprising $Si_3N_x$, where "x" is less than 4 and at least 3;

forming charge-storage material in the channel openings elevationally along the charge-blocking material comprising $Si_3N_x$; and forming insulative charge-passage material then transistor channel material in the channel openings laterally over the charge-storage material.

27. A method of forming an array of elevationally-extending strings of memory cells, the method comprising:

forming a stack comprising vertically-alternating tiers of different composition first and second materials, the first material being insulative;

forming elevationally-extending channel openings into the alternating tiers;

forming charge-blocking material comprising $Si_3N_x$, where "x" is less than 4 and at least 3, in the channel openings elevationally along the alternating tiers, the forming of the $Si_3N_x$ comprising:

decomposing a Si-comprising precursor molecule into at least two decomposition species that are different from one another, at least one of the at least two different decomposition species comprising Si;

contacting an outer substrate surface with the at least two decomposition species, at least one of the decomposition species that comprises Si attaching to the outer substrate surface to comprise an attached species; and after the contacting an outer substrate surface with the at least two decomposition species, contacting the attached species with a N-comprising precursor that reacts with the attached species to form a reaction product comprising $Si_3N_x$, where "x" is less than 4 and at least 3;

forming charge-storage material in the channel openings elevationally along the alternating tiers and the charge-blocking material comprising $Si_3N_x$;

forming insulative charge-passage material in the channel openings elevationally along the charge-storage material;

forming transistor channel material in the channel openings elevationally along the insulative charge-passage material; and after forming the transistor channel material, replacing at least some of the second material with control-gate material having terminal ends corresponding to control-gate regions of individual memory cells.

28. A programmable charge-storage transistor comprising:

channel material;
insulative charge-passage material;
charge-storage material;
a control gate; and
charge-blocking insulator material between the charge-storage material and the control gate, the charge-blocking insulator material comprising $Si_3N_x$, where "x" is less than 4 and at least 3.

\* \* \* \* \*